United States Patent [19]

Eckberg

[11] Patent Number: 4,587,137

[45] Date of Patent: May 6, 1986

[54] NOVEL DUAL CURE SILICONE COMPOSITIONS

[75] Inventor: Richard P. Eckberg, Saratoga Springs, N.Y.

[73] Assignee: General Electric Company, Waterford, N.Y.

[21] Appl. No.: 778,173

[22] Filed: Sep. 19, 1985

Related U.S. Application Data

[63] Continuation-in-part of Ser. No. 656,106, Sep. 28, 1984, abandoned.

[51] Int. Cl.$^4$ .............................................. B05D 3/06
[52] U.S. Cl. .................................... 427/54.1; 528/15; 528/31; 528/32; 528/24; 428/427; 428/447; 522/11; 522/13; 522/22; 522/24; 522/26; 522/29; 522/99
[58] Field of Search ...................... 528/15, 31, 32, 24; 427/54.1; 428/447; 204/159.13

[56] References Cited

U.S. PATENT DOCUMENTS

| | | | |
|---|---|---|---|
| 4,061,609 | 12/1977 | Bobear | 528/24 |
| 4,322,320 | 3/1982 | Caprino | 528/24 |
| 4,329,275 | 5/1982 | Hatanaka et al. | 528/24 |
| 4,375,523 | 3/1983 | Hatanaka et al. | 528/24 |
| 4,487,906 | 12/1984 | Kniege et al. | 528/24 |

*Primary Examiner*—Melvyn I. Marquis
*Attorney, Agent, or Firm*—Gary L. Loser

[57] ABSTRACT

There is provided a method for making curable compositions containing silicon-bonded hydrogen atoms and silicon-bonded olefinic radicals, the improvement comprising adding at least one free radical type photoinitiator and at least one precious metal or precious metal-containing hydrosilation catalyst so that crosslinking is effected by two separate mechanisms. The curable compositions and articles made therefrom are also provided.

46 Claims, No Drawings

NOVEL DUAL CURE SILICONE COMPOSITIONS

This application is a continuation-in-part of application Ser. No. 656,106, filed 09/28/84, now abandoned.

Reference is made to the copending patent application of Richard P. Eckberg, Ser. No. 656,047, now abandoned, filed on the same date as the present application and assigned to the same assignee as the present invention.

BACKGROUND OF THE INVENTION

The present invention generally relates to compositions which are curable by two different mechanisms. More particularly, the present invention relates to compositions which cure by both a free radical catalyzed UV-hydrosilation reaction and a platinum catalyzed thermal hydrosilation reaction.

Silicone compositions have become widely accepted as protective coatings for electronic components mounted on circuit boards. The moisture resistance, thermal stability and resistivity of silicones make them ideal for this purpose. Previously developed silicone conformal coatings have been heat curable and furnished in organic solvents, however, high energy costs as well as safety and environmental considerations have led to the development of such alternate technologies as ultraviolet radiation curable silicone conformal coatings.

Both heat curable and UV-curable silicone conformal coatings have certain disadvantages. The use of heat curable conformal coatings risks damaging many fragile, heat sensitive electronic components. Consequently, thermal cure cycles can be extremely long, which in turn reduces production of coated circuit boards. On the other hand, while radiation curable silicone conformal coatings speed processing and avoid damaging the electronic components, in many instances a complete cure of the conformal coating is not effected due to what is called the "shadow effect". Briefly, the shadow effect is caused by components mounted on circuit boards which, because they project off the surface of the board, cast shadows and thereby prevent effective curing. While persons skilled in the art can overcome much of the shadow effect with mirrors, there will always be crevices or other areas where ultraviolet light simply cannot penetrate and thus where UV-curable compositions cannot be cured.

In view of the foregoing, the skilled artisan will appreciate that it is highly desirable to have available a composition which is both UV-curable and thermally curable either at room temperature or at elevated temperatures in order to overcomme such shortcomings.

It is also desirable that such compositions can be utilized in other applications, for example, as silicone release coatings.

Platinum catalyzed addition curable silicone compositions are well known in the art. For example, Grenoble in U.S. Pat. No. 3,900,617 disclosed that flexible sheet material can be rendered non-adherent to surfaces which normally adhere thereto by coating the sheet material with a coating composition formed from (1) a vinyl chainstopped polysiloxane, (2) a hydrogen-containing polysiloxane and (3) a platinum catalyst effective to cause copolymerization of (1) and (2).

Other variations of such technology are disclosed in U.S. Pat. Nos. 4,256,870 and 4,340,647 to Eckberg, both of which are assigned to the same assignee as the present invention and which are incorporated by reference into the instant disclosure.

Ohto et al., U.S. Pat. No. 3,865,588, discloses photopolymerizable compositions which contain at least one organopolysiloxane having an unsaturated radical of the formula

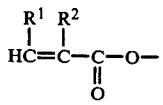

where $R^1$ is a hydrogen atom, a phenyl radical or a halogen substituted phenyl radical and $R^2$ is a hydrogen atom or a methyl radical. Exemplary of such radicals are the acryloxy radical, methacryloxy radical, cinnamoyloxy radical or a halogenated cinnamoyloxy radical.

In U.S. Pat. No. 3,726,710 to Berger et al. there is disclosed a composition comprising a vinyl group containing polyorganosiloxane having a sensitizer added thereto and which is curable by exposing it to high intensity ultraviolet rays.

Hatanaka et al., U.S. Pat. No. 4,451,634, discloses silicone elastomeric compositions suitable for ultraviolet ray curing comprising (A) 100 parts by weight of a polyorganosiloxane of the general formula

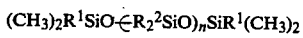

wherein $R^1$ represents hydrogen or a monovalent radical selected from methyl, vinyl and hydroxy, $R^2$ represents hydrogen or a substituted or unsubstituted monovalent hydrocarbon radical, 0.02–49.95% based on the total number of $R^1$ and $R^2$ groups are vinyl radicals, 0.05–49.98% based on the total number of $R^1$ and $R^2$ groups are hydrogen, and n represents a number from 10 to 10,000; (B) 0.5 to 10 parts by weight of a polyorganosiloxane having the formula

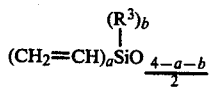

wherein $R^3$ is a substituted or unsubstituted monovalent hydrocarbon radical other than vinyl, a represents a number of $0.01 \leq a \leq 1$ on average, b represents a number of $0 \leq b\ 3$ on average, and a $+b$ is a number from 1 to 3; and (C) 0.1 to 10 parts by weight of a peroxy ester of the formula

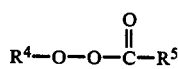

wherein $R^4$ is a substituted or unsubstituted monovalent aliphatic radical and $R^5$ is a substituted or unsubstituted monovalent aromatic radical.

Eckberg et al., U.S. Patent Application Ser. No. 527,299, filed Aug. 26, 1983, now U.S. Pat. No. 4,558,147, and assigned to the same assignee as the present invention, discloses an ultraviolet radiation curable composition comprising: (A) a diorganopolysiloxane comprising units of the formula RR'SiO, wherein R is hydrogen or a $C_{1-8}$ alkyl radical and R' is hydrogen, a $C_{1-8}$ alkyl radical or a monovalent mercaptoalkoxyalkyl-functional organic radical of 2 to 20 carbon atoms, (B) a polysiloxane consisting of from 0.5 to 100 mole percent of vinyl functional siloxane units of the formula $(CH_2=CH)R_nSiO_{(3-n)/2}$, where R is hydrogen or a $C_{1-8}$ alkyl radical and n has a value of 0 to 2, inclusive, and (C) a catalytic amount of photoinitiator.

Nowhere, however, to applicant's knowledge, is there disclosed or suggested a silicone composition which cures by both a free radical catalyzed UV-hydrosilation reaction and a platinum catalyzed hydrosilation reaction, and thereby avoids the shortcomings of those compositions which cure by only one of the recited mechanisms.

SUMMARY OF THE INVENTION

It is one object of the present invention to provide compositions which are curable by both a free radical catalyzed UV-hydrosilation reaction and a platinum catalyzed hydrosilation reaction.

It is another object of the present invention to provide articles such as circuit boards and the like having such compositions cured thereon.

Another object of the present invention is to provide methods for making the foregoing compositions and articles.

In accordance with the present invention there is provided a curable composition comprising:

(A) a polysiloxane having the general formula:

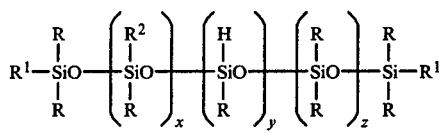

wherein each R is an independently selected substituted or unsubstituted monovalent hydrocarbon radical having from 1 to 20 carbon atoms; $R^1$ is hydrogen, a hydroxyl radical, or a substituted or unsubstituted hydrocarbon or hydrocarbonoxy radical having from 1 to 20 carbon atoms; $R^2$ is a lower alkenyl radical; x is a number such that there is from about 0.1 to about 20 mole percent alkenyl-containing siloxy units; y is a number such that there is present from about 0.5 to about 50 mole percent hydrogen-containing siloxy units; and $x+y+z$ is a number such that the viscosity of said polysiloxane is from about 25 centipoise to about 2,500,000 centipoise at 25° C.;

(B) a free radical type photoinitiator;

(C) a precious metal or precious metal containing hydrosilation catalyst;

(D) optionally, an organohydrogenpolysiloxane;

(E) optionally, an olefin-containing polydiorganosiloxane; and (F) optionally, an inhibitor.

DESCRIPTION OF THE INVENTION

In its broadest aspect, the present invention involves adding both a photoinitiator or photocatalyst and a precious metal or precious metal-containing hydrosilation catalyst to a curable composition having silicon-bonded hydrogen atoms and silicon-bonded alkenyl radicals which preferably are vinyl radicals. The silicon-bonded hydrogen atoms and the silicon-bonded alkenyl radicals can be on the same or different polysiloxane chains. What is essential to the present invention is that, because of the presence of a photocatalyst, the silicon-bonded hydrogen atoms and silicon-bonded alkenyl radicals will crosslink upon exposure to ultraviolet radiation, and that, because of the presence of a precious metal or precious metal-containing catalyst, the silicon-bonded hydrogen atoms and silicon-bonded alkenyl radicals will crosslink at room temperature or at elevated temperatures.

In a preferred embodiment, the present invention provides a curable composition comprising:

(A) a polysiloxane having the general formula:

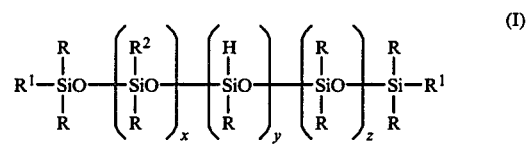

wherein each R is an independently selected substituted or unsubstituted monovalent hydrocarbon radical having from 1 to 20 carbon atoms; $R^1$ is hydrogen, a hydroxyl radical, or a substituted or unsubstituted hydrocarbon or hydrocarbonoxy radical having from 1 to 20 carbon atoms; $R^2$ is a lower alkenyl radical; x is a number such that there is present from about 0.1 to about 20 mole percent alkenyl-containing siloxy units; y is a number such that there is present from about 0.5 to about 50 mole percent hydrogen-containing siloxy units; and $x+y+z$ is a number such that the viscosity of said polysiloxane is from about 25 centipoise to about 2,500,000 centipoise at 25° C.;

(B) a free radical type photoinitiator;

(C) a precious metal or precious metal containing hydrosilation catalyst;

(D) optionally, an organohydrogenpolysiloxane;

(E) optionally, a olefin-containing polydiorganosiloxane; and (F) optionally, an inhibitor.

Polysiloxane (A) of this invention is represented by the above Formula I, wherein the R groups can be any substituted or unsubstituted hydrocarbon radical having from 1 to 20 carbon atoms, for example, alkyl radicals such as methyl, ethyl, propyl, butyl, pentyl, hexyl, octyl and decyl; alkenyl radicals such as vinyl and allyl; cycloalkyl radicals such as cyclohexyl and cycloheptyl; aryl radicals such as phenyl; aralkyl radicals such as beta-phenylethyl; and any of such radicals radicals wherein a part or all of the hydrogen atoms are replaced, for example, by halogen atoms such as fluorine, chlorine or bromine; cyanoethyl radicals or 3,3,3-trifluoropropyl radicals. From the viewpoint of availability and ease of synthesis, it is preferable that substantially all of the R radicals be either methyl or methyl and phenyl.

The $R^1$ radicals can be any of the foregoing R radicals and, in addition, can also be a hydrogen atom, hydroxyl radical or a hydrocarbonoxy radical having from 1 to 20 carbon atoms such as, for example, methoxy, ethoxy and propoxy. $R^2$ can be any lower alkenyl radicals such as vinyl, allyl, propenyl, butenyl and the like and most preferably $R^2$ is vinyl.

It is important that polysiloxane (A) contains silicon-bonded vinyl radicals and silicon-bonded hydrogen atoms in the same molecule. The number of vinyl-containing siloxy units is generally from about 0.1 to about 20 mole percent based on the total number of siloxy units in polysiloxane (A), and the number of hydrogen-containing siloxy units is generally from about 0.5 to about 50 mole percent based on the total number of siloxy units in polysiloxane (A).

The artisan will appreciate that the values for x and y can be zero in Formula I provided that in such case $R^1$ is either vinyl or hydrogen respectively. It is also possible to employ a mixture of polysiloxanes wherein some of the polymers have hydrogen only on the polymer chain and vinyl radicals only in the terminal positions. Similarly, it is possible to utilize a mixture wherein the hydrogen is present only at the terminal positions and the vinyl radicals present only on the polymer chain. Other variations will be obvious to those of ordinary skill in the art, for example, the vinyl-containing siloxy units and/or the hydrogen-containing siloxy units are present both on the polymer chain and at the chain terminating positions.

When the number of silicon-bonded vinyl radicals or hydrogen atoms is less than the above-said ranges, respectively, the adhering ability of the cured composition is reduced. When the number of these substituents is more than the above-said ranges, respectively, thermal resistance is reduced or the curing rate is inadequate. When polysiloxane (A) contains silicon-bonded vinyl radicals and silicon-bonded hydrogen atoms within the stated ranges, no foaming occurs upon exposure to ultraviolet radiation due to generation of hydrogen gas and the composition is sufficiently "set" after brief exposure to UV radiation to allow the coated article to be placed elsewhere for the thermal curing. Thermal curing, for purposes of the instant application, includes subjecting the composition to elevated temperatures or merely allowing the precious metal catalyzed hydrosilation reaction to take place at room temperature.

The number of diorganosiloxy groups present in polysiloxane (A) is not critical and can be anywhere from zero to about 99.6 mole percent. Generally there should be sufficient diorganosiloxy units to provide polysiloxane (A) a viscosity of from about 25 centipoise to about 2,500,000 centipoise at 25° C.

The artisan will appreciate that in addition to the difunctional units illustrated in Formula I, there may also be present trifunctional siloxy units of the formula $R\ SiO_{1.5}$, where R is as previously defined, and/or tetrafunctional siloxy units of the formula $SiO_2$. The number of such units employed, if any, will depend upon the particular application under consideration and can readily be determined by one of ordinary skill in the art without undue experimentation.

In a preferred embodiment of the present invention there is present from about 1.0 to about 10.0 mole percent vinyl-containing siloxy units, from about 2.0 to about 20.0 mole percent hydrogen-containing siloxy units, and the viscosity of polysiloxane (A) is from about 100 centipoise to about 10,000 centipoise at 25° C.

Free radical type photoinitiators or photocatalysts are well known in the art. Photoinitiator (B) of the present invention can be any known free radical type photoinitiator effective for promoting crosslinking between silicon-bonded vinyl groups and silicon-bonded hydrogen atoms.

Especially preferred photoinitiators for practicing the present invention are disclosed by Hatanaka et al., U.S. Pat. No. 4,451,634 and by Eckberg et al., U.S. Patent Application Ser. No. 527,299, filed Aug. 26, 1983, and assigned to the same assignee as the present invention. The foregoing patent and patent application are incorporated by reference into the present application for their teaching related to photoinitiators. Briefly, Eckberg et al. disclose certain perbenzoate esters having the general formula:

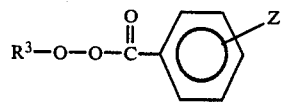

where $R^3$ is a monovalent alkyl or aryl group and Z is hydrogen, alkyl, halogen, nitro, amino, or amido. The nature of the Z substituent will affect the stability of the peroxy bond; an electron-poor substituent stabilizing the peroxy bond and an electron-rich substituent making the peroxy bond more reactive. These perbenzoate esters may be synthesized in known ways, such as by reacting benzoyl halides with hydroperoxides (see, e.g. the descriptions in Blomquist and Berstein, J. Amer. Chem. Soc., 73, 5546 (1951)). Preferred perbenzoate esters include t-butylperbenzoate and its para-substituted derivatives, t-butylper-p-nitrobenzoate, t-butylper-p-methoxybenzoate, t-butylper-p-methylbenzoate and t-butylper-p-chlorobenzoate.

The amount of photoinitiator employed is not critical, so long as proper crosslinking is achieved. As with any catalyst, it is preferable to use the smallest effective amount possible. Generally, the amount of photoinitiator is at least one part by weight and, preferably, can be anywhere from about 1 to about 10 parts by weight based on 100 parts by weight of polysiloxane (A). More preferably, the photocatalyst level is from about 1 to about 5 parts by weight per 100 parts by weight polysiloxane (A).

In addition to t-butylperbenzoate and its derivatives as photoinitiators, Eckberg et al. disclose that the inclusion of certain photosensitizers enhances reactivity. The photosensitizers are polyaromatic compounds possessing the

chromophone, where Ph is phenyl, and having at least two benzene rings which may be fused or bridged by organic radicals or hetero-radicals such as oxa, thio and the like. Preferred photosensitizers are benzophenone and t-butylanthraquinone.

Other photoinitiators, whose suitability for use in a particular situation can easily be ascertained by the artisan, are described in U.S. Pat. Nos. 3,759,807, 3,968,305, 3,966,573, 4,113,592, 4,131,529, 4,130,600, and 4,348,462. All of these patents are incorporated by reference into the instant disclosure for their teachings related to photoinitiators.

Component (C) can be any precious metal or precious metal-containing catalyst effective for initiating a thermal hydrosilation cure reaction. Especially included are all of the well known platinum and rhodium catalysts which are effective for catalyzing the addition reaction between silicon-bonded hydrogen atoms and silicon-bonded olefinic groups. Examples of platinum or platinum-containing complexes, which are the most preferred of the precious metal catalysts, include platinum metal on charcoal, the platinum hydrocarbon complexes described in U.S. Pat. Nos. 3,159,601 and 3,159,662 to Ashby, the platinum alcoholate catalysts described in U.S. Pat. No. 3,220,970 to Lamoreaux, the platinum complexes described in U.S. Pat. No. 3,814,730 to Karstedt, and the platinum chloride-olefin complexes described in U.S. Pat. No. 3,516,946 to Modic. All of the aforesaid U.S. patents relating to platinum or platinum-containing catalysts are incorporated by reference into the instant disclosure.

The most preferred catalyst for facilitating the thermal hydrosilation reaction is the Ashby catalyst described in U.S. Pat. No. 3,159,601. Other platinum metal and platinum-containing catalysts which can be employed in the present invention are well known to those skilled in the art.

Hydrosilation catalysts other than those based on platinum may also be used to effect thermal curing. For example, complexes of the metals rhodium, ruthenium, palladium, osmium and irridium can be utilized. Of the non-platinum based catalysts, those based on rhodium are most preferred. The preparation and description of preferred rhodium catalysts are set forth in U.S. Pat. No. 4,262,107 to Eckberg, which is also incorporated herein by reference.

As with photoinitiator (B), the amount of precious metal or precious-metal containing catalyst (C) is not critical so long as proper crosslinking is achieved. Typically, the amount of precious metal or precious metal-containing catalyst is from about 10 to about 500 ppm as metal atoms based on polysiloxane (A). If the optional organohydrogenpolysiloxane (D) and vinyl containing polysiloxane (E) are included it may be desirable to utilize a greater amount of catalyst (C). Of course, the skilled artisan can determine the appropriate amount of catalysts (B) and (C) without undue experimentation. The artisan will also appreciate that it is within the scope of the present invention to employ mixtures of the various photocatalysts and precious metal or precious metal-containing catalysts.

Organohydrogensiloxane (D) can be either a fluid, resin or mixture thereof which those skilled in the art utilize as a crosslinking agent in addition curable silicone systems. Particularly useful organohydrogenpolysiloxanes for practicing the present invention are trimethyl chainstopped polymethylhydrogensiloxane fluids having from approximately 10% to 100% SiH groups, any remaining groups being dimethylsiloxy units, and having a viscosity in the range from about 10 to about 1000 centipoise at 25° C. However, any organohydrogenpolysiloxane having the general formula

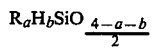 (III)

is within the scope of the present invention. Such organohydrogenpolysiloxanes are well known in the art, for example, as described in U.S. Pat. Nos. 3,344,111 and 3,436,366, both of which are incorporated by reference into the present disclosure.

Among the radicals included within R of Formula III are alkyl such as methyl, ethyl and propyl; cycloalkyl such as cyclopentyl, cyclohexyl and cycloheptyl; aryl such as phenyl, naphthyl, tolyl and xylyl; aralkyl such as phenylethyl and phenylpropyl; and substituted radicals of any of the foregoing, for example, halogen substituted and cyanoalkyl substituted.

Other organohydrogenpolysiloxane fluids are well known in the art and are described in greater detail in U.S. Pat. No. 4,448,815 to Grenoble and Eckberg, which is also incorporated herein by reference.

It is possible to utilize an organohydrogenpolysiloxane resin in place of, or in addition to, the organohydrogenpolysiloxane fluid. Such organohydrogenpolysiloxane resins are also well known in the art, for example, as described in U.S. Pat. No. 4,041,010 to Jeram which is incorporated by reference into the instant disclosure. Briefly, organohydrogenpolysiloxane resins comprise either

units and $SiO_2$ units, where the ratio of R+H units to $SiO_2$ units ranges from 1.0 to 2.7 and where R is as previously defined, or

units, $R_2SiO$ units, and $SiO_2$ units, where the ratio of R+H units to $SiO_2$ units ranges from 1.2 to 2.0 and where R is as previously defined.

If an organohydrogenpolysiloxane is employed, it can be employed in any amount to obtain specific properties in the cured product. Generally, it should be utilized in a range of from about 1.0 parts by weight to about 10 parts by weight per 100 parts by weight of polysiloxane (A).

Another optional component for practicing the instant invention is olefin-containing polydiorganosiloxane (E). As with organohydrogenpolysiloxane (D), olefin-containing polydiorganosiloxane (E) can be either a fluid or a resin or a mixture thereof. Most preferably component (E) is a vinyl-containing polydiorganosiloxane. A typical vinyl-containing polydiorganosiloxane fluid has the formula:

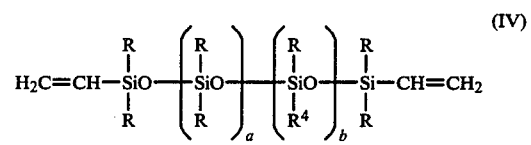 (IV)

wherein R is as previously defined; $R^4$ is a radical having alkenyl unsaturation, preferably vinyl; and a and b are positive integers such that the vinyl chainstopped polysiloxane has up to about 20% by weight $R^4$ groups. The viscosity of such a polysiloxane ranges from about 50 to about 100,000 centipoise at 25° C. Such polysiloxane fluids are also described in U.S. Pat. No. 4,448,813 to Grenoble and Eckberg.

Vinyl-containing silicone resins are also known in the art, for example, as described in U.S. Pat. No. 4,041,010 to Jeram. Generally these resins are selected from the class consisting of resins having $ViR_2SiO_{0.5}$ units and $SiO_2$ units where the ratio of hydrocarbon substituents to Si varies from 0.8 to 2.7 and resins having $ViR_2SiO_{0.5}$ units, $R_2SiO$ units and $SiO_2$ units where the ratio of hydrocarbon substituents to Si varies from 0.8 to 2.4. For more specific details relating to such resins and their preparation the reader is referred to the cited Jeram Pat. No. 4,041,010.

If a vinyl-containing polysiloxane is employed in the present invention it can be utilized in any amount. As the artisan will appreciate, including precious metal or precious metal-containing catalyst (C) in the same package as polysiloxane (A) will result in product gelation or curing before it reaches the consumer. Accordingly, in a commercial environment, olefin-containing polysiloxane (E) serves primarily as a carrier of precious metal catalyst (C). Thus, in a preferred embodiment of the present invention, the curable composition is provided in two or more packages; one package including therein the vinyl-containing polysiloxane, precious metal catalyst and optional inhibitor, and the other package containing the remaining ingredients. Such two package systems are well known in the art. A particularly preferred multi-component packaging system can be adapted from the teachings of Grenoble and Eckberg in U.S. Pat. No. 4,448,815.

It is also contemplated that an inhibitor (F) can be included in the curable composition of the present invention in order to extend the work life of the composition. One example of a suitable inhibitor is disclosed in U.S. Pat. No. 4,256,870 wherein Eckberg teaches the use of organic esters of maleic acid to selectively retard the thermal addition cure reaction.

Eckberg discloses in U.S. Pat. No. 4,262,107 that other suitable inhibitor compounds are certain acetylenic compounds, olefinic carboxylic acid esters of aliphatic alcohols such as vinyl acetate, alkenyl isocyanurates and mixtures thereof.

In U.S. patent application Ser. No. 458,420, filed June 17, 1983, now U.S. Pat. No. 4,476,166, and assigned to the same assignee as the present invention, Eckberg discloses that a blend of a dicarboxylic acid ester having carbon to carbon unsaturation and an olefinic carboxylic acid ester of an aliphatic alcohol is particularly effective as an inhibitor. Each of the foregoing Eckberg patents and patent application are incorporated herein by reference.

In another aspect of the present invention there are provided methods for making the curable compositions of the present invention and methods for making articles having the compositions cured thereon.

The curable compositions are prepared merely by combining the various ingredients or by mixing the packages in which the various ingredients were provided. The articles of the present invention are prepared by applying such composition to a substrate such as a circuit board if it is to be used as a conformal coating, or to a flexible sheet material such as Mylar ® or paper if it is to be used as a release coating, thereafter exposing the coated substrate to ultraviolet radiation sufficient to set the composition, and finally allowing curing to be completed by exposing the article to either room temperature or elevated temperature. Of course, the higher the temperature, the more rapidly complete cure will take place.

In order that those skilled in the art might be better able to practice the present invention, the following examples are given by way of illustration and not by way of limitation. All parts are by weight unless otherwise indicated.

EXAMPLE 1

A silicone terpolymer designated polymer A was prepared via acid-catalyzed equilibration of polymethylhydrogensiloxane, sym-tetramethyl-tetravinylcyclotetrasiloxane, and octamethylcyclotetrasiloxane. The resulting polymer contained about 5 weight percent methylhydrogensiloxy units, about 7 weight percent methylvinylsiloxy units and about 88 weight percent dimethylsiloxy units, and had a viscosity of 1800 centipoise at 25° C. To this fluid there was added 2.5 weight percent benzophenone and 5.0 weight percent t-butylperbenzoate. Next, 130 grams of the polymer A/photocatalyst blend was combined with 7 grams of a 25 centipoise organohydrogenpolysiloxane resin. Nine parts of the resulting polymer A/photocatalyst/organohydrogen-polysiloxane resin blend were then mixed with 1 part of a 37.5% solution of vinyl MQ resin in a linear dimethylvinylsiloxy-chainstopped polydimethylsiloxane fluid with 25 ppm of a platinum-octyl alcohol complex, as platinum metal, and 0.1% diallylmaleate inhibitor therein. This 9:1 blend is the curable composition of the present invention. It should be noted that a coating bath of such composition is clear, water-white and contains in all, 2-3 ppm platinum complex catalyst as platinum metal, 4.5 weight percent t-butylperbenzoate and 2.25 weight percent benzophenone catalysts.

The curable composition was manually coated on polyethylene or supercalendered kraft substrates and cure qualitatively ascertained immediately following exposure to two medium pressure mercury vapor UV sources mounted across a moving conveyor housed in a PPG Model QC 1202 AN Processor. Curing was effected under a nitrogen blanket and the results set forth in Table I.

TABLE I

| Exp. | Thickness, Mils | Total lamp power, watts | Line speed, fpm | Observations |
|---|---|---|---|---|
| 1 | 2 | 600 | 50 | Complete cure through section |
| 2 | 2 | 400 | 50 | Complete cure through section |
| 3 | 4 | 400 | 100 | Complete cure through section |
| 4 | 8 | 400 | 100 | 'soft' cure - set up to a non-tacky, non-flowing mass; cure confined to surface of coating |
| 5 | 8 | 400 | 200 | NO CURE |

The 8 mil specimen (experiment #4) was allowed to sit undisturbed at 75° F. room temperature for 17 hours following UV exposure at which time it was observed that the 8 mil film was completely cured throughout the whole section.

EXAMPLE 2

Five grams of a blend of 5 parts of 25 centipoise orangohydrogenpolysiloxane resin and 100 parts of polymer A from Example I were blended with 5 grams of a 37.5% solution of vinyl MQ resin in a linear dimethylvinylsiloxy chainstopped polydimethylsiloxane fluid containing 24 ppm platinum alcoholate catalyst as Pt metal, 10% t-butylperbenzoate and 2.5% benzophenone. There was thus provided a curable composition that was clear in color and contained about 12 ppm Pt, 5% t-butylperbenzoate and 1.25% benzophenone catalysts. Four mil thick coatings of this composition were exposed to UV radiation on different substrates and under different conditions. The results are provided in Table II.

TABLE II

| Exp # | Substrate | lamp power | line speed | Atm | Observations |
|---|---|---|---|---|---|
| 1 | PEK | 400 watts | 100 fpm | $N_2$ | Partial cure - soft surface easily smeared. |
| 2 | PEK | 600 watts | 100 fpm | $N_2$ | Well-defined 'skin' cure - confined to surface. |
| 3 | PEK | 600 watts | 50 fpm | $N_2$ | Complete cure through section |
| 4 | SCK | 500 watts | 20 fpm | $N_2$ | Complete cure - good anchorage |
| 5 | SCK | 400 watts | 20 fpm | AIR | Through-cured; good anchorage |
| 6 | SCK | 400 watts | 50 fpm | AIR | Surface cure only; poor anchorage |

The partially cured compositions from experiments 1, 2 and 6 were then set aside in the dark at ambient temperature for 12 days at which time they were observed to be completely cured and well anchored to their substrates.

EXAMPLE 3

In this example an experiment was set up to mimic the shadow effect encountered in the coating of circuit boards and other such substrates. This experiment consisted of coating a four mil section of curable composition of the present invention on a 12 inch by 4 inch stainless steel panel, and then mounting an L-shaped 1 inch wide metal piece across the coated panel so as to effectively block ultraviolet radiation from reaching the composition across a 1 inch wide strip. The coatings were given 1 second exposure to 400 watts focused UV radiation in an air atmosphere.

The coating composition consisted of 49 parts of polymer A of Example 1, 1 part of polymethylhydrogensiloxane sold by General Electric Company under the trademark SS-4300c, and 50 parts of a 37.5% solution of vinyl MQ resin in a linear dimethylvinyl chainstopped polydimethylsiloxane fluid containing 24 ppm of a platinum complex as Pt metal, 10% t-butylperbenzoate and 2.5% benzophenone. The results are provided in Table III as a function of time. Thermal cure was effected at room temperature in the dark following UV exposure.

TABLE III

| Time | Exposed Section | Shadowed Section |
|---|---|---|
| initial | Cured to solid; easily smeared. | Liquid - no cure |
| 20 hours | Cured to solid; easily smeared. | Set up to tacky, non-flowing gel. |
| 2 days | Cured - surface shows slight smear | Non-tacky, easily smeared surface. |
| 3 days | Cured to non-smear coating through section | Through cure - no smear, good anchorage. |

EXAMPLE 4

A terpolymer was prepared by blending in a nitrogen atmosphere at 100° C. for 16 hours in the presence of 10 grams Filtrol 20 acid clay catalyst, 150 grams trimethylstopped linear polydimethyl-methylhydrogensiloxane, 15 grams sympdivinyltetramethyldisiloxane and 1260 grams octamethylcyclotetrasiloxane. The resulting polymer was filtered, then stripped at 160° C. under 20 mm vacuum to furnish 1182 grams of a 200 centipoise fluid. The polymer was treated with 2 weight % benzophenone by gentle agitation at 60° C. This material was identified as "bath a".

There was next prepared a "bath b" which consisted of 100 parts by weight bath a plus 4 parts by weight t-butylperbenzoate; and a "bath c" which consisted of 90 parts by weight bath a, 10 parts by weight of a mixture of a polymethylhydrogensiloxane fluid (SL 5000, sold by General Electric Company) plus 2 weight percent benzophenone plus 300 ppm of a platinum complex catalyst as platinum metal, and 4 parts by weight t-butylperbenzoate. Analysis of these compositions was carried out by manually coating layers less than 1 mil in thickness on 40# supercalendered kraft stock, exposing the coated sheets to UV radiation, or placing the coated sheets in a hot air oven, or both. The UV intensity was 400 watts in the PPG Lab Processor while the hot air oven was maintained at 150° C. Cure was qualitatively accessed as a function of Processor line speed and oven dwell time. The results are set forth in Table IV.

TABLE IV

| Bath | UV Line Speed | UV atm | Thermal Dwell Time | Remarks |
|---|---|---|---|---|
| a: | 50 fpm | $N_2$ | — | No migration, slight smear |
|  | 20 fpm | Air | — | No migration, slight smear |
|  | — | — | 60 sec. | No cure |
| b: | 100 fpm | $N_2$ | — | No migration, slight smear |
|  | 200 fpm | $N_2$ | — | No migration, easily smeared |
|  | 20 fpm | Air | — | No migration, slight smear |
|  | 50 fpm | Air | — | Slight migration, easily smeared |
|  | — | — | 60 sec. | No cure |
| c: | 100 fpm | $N_2$ | — | No migration, no smear |
|  | 200 fpm | $N_2$ | — | Slight migration, easily smeared |
|  | 20 fpm | Air | — | No migration, no smear |
|  | 50 fpm | Air | — | No migration, slight smear |
|  | — | — | 10 sec. | Undercured - migrates |
|  | — | — | 15 sec. | No migration, no smear |
|  | 100 fpm | Air | 10 sec. | No migration, slight smear |

Coating composition (b) displayed the same synergistic effect of benzophenone and t-butylperbenzoate described in U.S. patent application Ser. No. 527,299 (Eckberg) filed Aug. 26, 1983, now Pat. No. 4,558,147 and assigned to the same assignee as the present invention. Coating composition (c), which included about 30 ppm of platinum-containing catalyst as Pt metal was observed to gel about 75 minutes after being blended. The inclusion of about 0.5% vinyl acetate in bath (c) was found to extend bath life to about 6 hours with no significant effect on UV cure or thermal cure.

Baths (b) and (c) were then made up as 20% solution in 1:1 acetone:hexane solvent and coated on #40 supercalendered kraft stock using a mechanical lab coater and #8 wire-wound rod. Coated sheets were cured by passing through the UV processor (400 watts lamp power) at (1) 100 feet per minute under nitrogen, (2) 20 feet per minute in air, and (3) at 100 feet per minute in air followed by 10 seconds oven dwell time at 150° C. Bath (b) failed to cure under the conditions of (3), however, the other sheets were smear and migration free. The cured sheets were subsequently laminated with a 5 mil adhesive coating having a supercalendered kraft backing. Two inch by eight inch tapes of these laminates were prepared and the force required to pull the silicone/SCK lamina from the adhesive/SCK lamina at a 180° angle and 400 feet per minute pull speed was recorded. Quantitative release data so obtained is provided in Table V.

TABLE V

| Bath | Cure Conditions | Release, in grams | | |
|---|---|---|---|---|
| | | Initial | 1 day aged | 2 weeks aged |
| b | 1 | 20–30 g | 25–30 g | 25–35 g |
| b | 2 | 35–40 g | 35–50 g | 40–50 g |
| c | 1 | 40–50 g | 35–45 g | 30–40 g |
| c | 2 | 60–75 g | 45–55 g | 40–55 g |
| c | 3 | 45–65 g | 25–35 g | 20–30 g |

That the sheets coated from "bath c" appear to have diminished release on aging may be indicative of post cure involving platinum catalyzed addition reactions following UV or thermal treatment.

I claim:

1. A curable composition comprising a polydiorganosiloxane containing silicon-bonded hydrogen atoms and silicon-bonded olefinic radicals in the same molecule, at least one part by weight per 100 parts by weight of said polydiorganosiloxane of at least one free radical photoinitiator and at least one precious metal-containing hydrosilation catalyst for effecting crosslinking of said silicon-bonded hydrogen atoms and said silicon bonded olefinic radicals.

2. A curable composition comprising:
(A) a polysiloxane having the general formula:

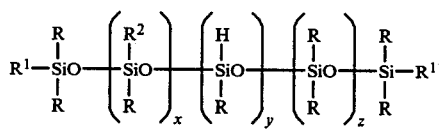

wherein each R is an independently selected substituted or unsubstituted monovalent hydrocarbon radical having from 1 to 20 carbon atoms; $R^1$ is hydrogen, a hydroxyl radical or a substituted or unsubstituted hydrocarbon or hydrocarbonoxy radical having from 1 to 20 carbon atoms; $R^2$ is a lower alkenyl radical; x is a number such that there is present from about 0.1 to about 20 mole percent alkenyl-containing siloxy units; y is a number such that there is present from about 0.5 to about 50 mole percent hydrogen-containing siloxy units; and x+y+z is a number such that the viscosity of said polysiloxane is from about 25 centipoise to about 2,500,000 centipoise at 25° C.;
(B) at least one part by weight per 100 parts by weight of said polydiorganosiloxane of at least one free radical photoinitiator; and
(C) a precious metal-containing hydrosilation catalyst.

3. The composition of claim 2 wherein substantially all of the R radicals are methyl or a mixture of methyl and phenyl.

4. The composition of claim 2 wherein $R^2$ is vinyl.

5. The composition of claim 2 wherein x is a number such that there is present from about 1.0 to about 10.0 mole percent vinyl-containing siloxy units; y is a number such that there is present from about 2.0 to about 20.0 mole percent hydrogen-containing siloxy units; and x+y+z is a number such that the viscosity of polysiloxane (A) is from about 100 centipoise to about 10,000 centipoise at 25° C.

6. The composition of claims 1 or 2 wherein the free radical photoinitiator has the general formula:

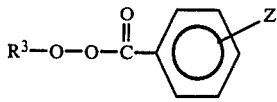

where $R^3$ is a monovalent alkyl or aryl group or a halogen and Z is hydrogen, alkyl, halogen, nitro, amino or amido.

7. The composition of claim 6 wherein the free radical photoinitiator is selected from the group consisting of t-butylperbenzoate, t-butylper-p-nitrobenzoate, t-butylper-p-methoxybenzoate, t-butylper-p-methylbenzoate, and t-butylper-p-chlorobenzoate.

8. The composition of claim 7 wherein the free radical photoinitiator is t-butylperbenzoate.

9. The composition of claim 6 wherein the photoinitiator further comprises a sensitizer which is a polyaromatic compound possessing a

chromophore, where pH is phenyl, and having at least two benzene rings which may be fused or bridged by organic radicals or hetero-radicals.

10. The composition of claim 9 wherein the photosensitizer is t-butylanthrquinone.

11. The composition of claims 1 or 2 wherein the precious metal-containing hydrosilation catalyst is selected from the group consisting of platinum metal, platinum complexes, rhodium metal and rhodium complexes.

12. The composition of claim 2 wherein the free radical photoinitiator is present in an amount of from about 1 to about 10 parts by weight per 100 parts by weight polysiloxane (A) and the precious metal-containing catalyst is present in an amount of from about 10 ppm to about 500 ppm as precious metal based on polysiloxane (A).

13. The composition of claim 2 further comprising an organohydrogenpolysiloxane.

14. The composition of claim 2 further comprising a vinyl-containing polysiloxane.

15. The composition of claim 2 further comprising an organohydrogenpolysiloxane and a vinyl-containing polysiloxane.

16. The composition of claim 2 or 15 further comprising an inhibitor effective for preventing curing of said composition at temperatures below the heat cure temperature.

17. A curable composition comprising:
(A) a polysiloxane having the general formula:

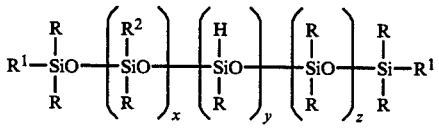

where R is substantially all methyl radicals or a mixture of methyl and phenyl radicals; $R^1$ is selected from the group consisting of hydrogen atoms, hydroxyl radicals, methyl radicals and methoxy radicals; $R^2$ is a vinyl radical; x is a number such that there is present from about 1.0 to about 10.0 mole percent vinyl-containing siloxy units; y is a number such that there is present from about 2.0 to about 20.0 mole percent hydrogen-containing siloxy units; and x+y+z is a number such that the viscosity of said polysiloxane varies from about 100 centipoise to about 10,000 centipoise at 25° C.;

(B) from 1 to 10 parts by weight per 100 parts by weight (A) of a photoinitiator selected from the group consisting of t-butylperbenzoate, t-butylper-p-nitrobenzoate, t-butylper-p-methoxybenzoate, t-butylper-p-methylbenzoate, and chlorobenzoate;

(C) from 10 ppm to 500 ppm based on (A) of a platinum-containing hydrosilation catalyst, as platinum metal;

(D) an organohydrogenpolysiloxane;

(E) a vinyl-containing polydiorganosiloxane; and (F) an inhibitor effective for preventing curing of said composition at temperatures below the heat cure temperature.

18. A method for making a curable composition comprising mixing a polydiorganosiloxane containing silicon-bonded hydrogen atoms and silicon-bonded olefinic radicals in the same molecule, at least one part by weight per 100 parts by weight of said polydiorganosiloxane of at least one free radical photoinitiator and at least one precious metal-containing hydrosilation catalyst for effecting crosslinking of said silicon-bonded hydrogen atoms and said silicon-bonded olefinic radicals.

19. A method for making a curable composition comprising mixing (A) a polysiloxane having the general formula:

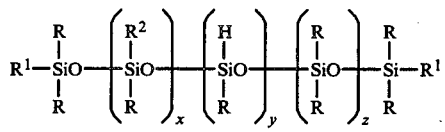

wherein each R is an independently selected substituted or unsubstituted monovalent hydrocarbon radical having from 1 to 20 carbon atoms; $R^1$ is hydrogen, a hydroxyl radical or a substituted or unsubstituted hydrocarbon or hydrocarbonoxy radical having from 1 to 20 carbon atoms; $R^2$ is a lower alkenyl radical; x is a number such that there is present from about 0.1 to about 20 mole percent alkenyl-containing siloxy units; y is a number such that there is present from about 0.5 to about 50 mole percent hydrogen-containing siloxy units; and x+y+z is a number such that the viscosity of said polysiloxane is from about 25 centipoise to about 2,500,000 centipoise at 25° C.

(B) at least one part by weight per 100 parts by weight of said polydiorganosiloxane of at least one free radical photoinitiator; and (C) a precious metal-containing hydrosilation catalyst.

20. The method of claim 19 wherein substantially all of the R radicals are methyl or a mixture of methyl and phenyl.

21. The method of claim 19 wherein $R^2$ is vinyl.

22. The method of claim 19 wherein x is a number such that there is present from about 1.0 to about 10.0 mole percent vinyl-containing siloxy units; y is a number such that there is present from about 2.0 to about 20.0 mole percent hydrogen-containing siloxy units; and x+y+z is a number such that the viscosity of polysiloxane (A) is from about 100 centipoise to about 10,000 centipoise at 25° C.

23. The method of claims 18 or 19 wherein the free radical photoinitiator has the general formula:

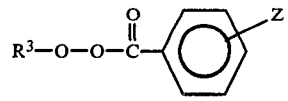

where $R^3$ is a monovalent alkyl or aryl group or a halogen and Z is hydrogen, alkyl, halogen, nitro, amino or amido.

24. The method of claim 23 wherein the free radical photoinitiator is selected from the group consisting of t-butylperbenzoate, t-butylper-p-nitrobenzoate, t-butylper-p-methoxybenzoate, t-butylper-p-methylbenzoate, and chlorobenzoate.

25. The method of claim 24 wherein the free radical photoinitiator is t-butylperbenzoate.

26. The method of claim 23 wherein the photoinitiator further comprises a sensitizer which is a polyaromatic compound possessing a

chromophore, where Ph is phenyl, and having at least two benzene rings which may be fused or bridged by organic radicals or hetero-radicals.

27. The method of claim 26 wherein the photosensitizer is t-butylanthraquinone.

28. The method of claims 18 or 19 wherein the precious metal-containing hydrosilation catalyst is selected from the group consisting of platinum metal, platinum complexes, rhodium metal and rhodium complexes.

29. The method of claim 19 wherein the free radical photoinitiator is present in an amount of from about 1 to about 10 parts by weight per 100 parts by weight polysiloxane (A) and the precious metal-containing catalyst is present in an amount of from about 10 ppm to about 500 ppm as precious metal based on polysiloxane (A).

30. The method of claim 19 further comprising mixing an organohydrogenpolysiloxane.

31. The method of claim 19 further comprising mixing a vinyl-containing polysiloxane.

32. The method of claim 19 further comprising mixing an organohydrogenpolysiloxane and a vinyl-containing polysiloxane.

33. The method of claim 19 or 32 further comprising mixing an inhibitor effective for preventing curing of said composition at temperatures below the heat cure temperature.

34. A method for making a curable composition comprising mixing:

(A) a polysiloxane having the general formula:

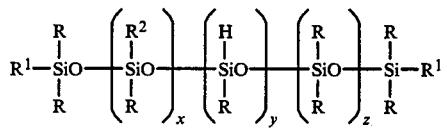

where R is substantially all methyl radicals or a mixture of methyl and phenyl radicals; $R^1$ is selected from the group consisting of hydrogen atoms, hydroxyl radicals, methyl radicals and methoxy radicals; $R^2$ is a vinyl radical; x is a number such that there is present from about 1.0 to about 10.0 mole percent vinyl-containing siloxy radicals; y is a number such that there is present from about 2.0 to about 20.0 mole percent hydrogen-containing siloxy radicals; and $x+y+z$ is a number such that the viscosity of said polysiloxane varies from about 100 centipoise to about 10,000 centipoise at 25° C.;

(B) from 0.1 to 10 parts by weight per 100 parts by weight of (A) of a photoinitiator selected from the group consisting of t-butylperbenzoate, t-butylper-p-nitrobenzoate, t-butylper-p-methoxybenzoate, t-butylper-p-methylbenzoate, and chlorobenzoate;

(C) from 10 ppm to 500 ppm based on (A) of a platinum-containing hydrosilation catalyst, as platinum metal;

(D) an organohydrogenpolysiloxane;

(E) a vinyl-containing polydiorganosiloxane; and (F) an inhibitor effective for preventing curing of said composition at temperatures below the heat cure temperature.

35. An article of manufacture comprising:
(a) 100 parts by weight of component A and
(b) 1 to 100 parts by weight of component B,
wherein component A comprises a mixture of (i) one or more polysiloxanes having both silicon-bonded olefinic radicals and silicon-bonded hydrogen atoms and (ii) at least one part by weight per 100 parts by weight of said polydiorganosiloxane of at least one free radical photoinitiator; and component B comprises a precious metal-containing photocatalyst dispersed in a vinyl-containing polysiloxane, and wherein component A and component B are contained separate from one another.

36. The article of claim 35 wherein component A (i) is a polysiloxane having the general formula:

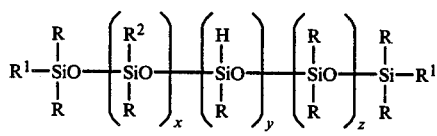

where each R is an independently selected substituted or unsubstituted monovalent hydrocarbon radical having from 1 to 20 carbon atoms; $R^1$ is hydrogen, a hydroxyl radical or a substituted or unsubstituted hydrocarbon or hydrocarbonoxy radical having from 1 to 20 carbon atoms; $R^2$ is a lower alkenyl radical; x is a number such that there is present from about 0.1 to about 20 mole percent vinyl-containing siloxy units; y is a number such that there is present from about 0.5 to about 50 mole percent hydrogen-containing siloxy units; and $x+y+z$ is a number such that the viscosity of said polysiloxane ranges from about 25 centipoise to about 2,500,000 centipoise at 25° C.

37. An article of manufacture prepared by the steps comprising:
I. mixing, so as to form a curable composition comprising:
(A) a polysiloxane having the general formula:

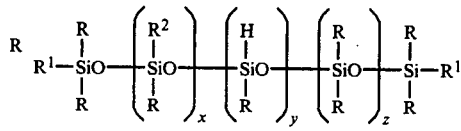

wherein each R is an independently selected substituted or unsubstituted monovalent hydrocarbon radical having from 1 to 20 carbon atoms; $R^1$ is hydrogen, a hydroxyl radical, or a substituted or unsubstituted hydrocarbon or hydrocarbonoxy radical having from 1 to 20 carbon atoms; $R^2$ is a lower alkenyl radical; x is a number such that there is present from about 0.1 to about 20 mole percent vinyl-containing siloxy units; y is a number such that there is present from about 0.5 to about 50 mole percent hydrogen-containing siloxy units; and $x+y+z$ is a number such that the viscosity of said polysiloxane is from about 25 to about 2,500,000 centipoise at 25° C.;

(B) at least one part by weight per 100 parts by weight of said polydiorganosiloxane of at least one free radical photoinitiator; and (C) a precious metal-containing hydrosilation catalyst;

II. applying a coating of said curable composition to a substrate; and

III. curing said coating to said substrate by exposing the coated substrate to a source of ultraviolet radiation and thereafter thermally curing said coating.

38. The article of claim 37 wherein the substrate is paper.

39. The article of claim 37 wherein the substrate is a circuit board.

40. The article of claim 37 wherein thermal curing is effected at room temperature.

41. The article of claim 37 wherein thermal curing is effected at an elevated temperature.

42. A method for making an article of manufacture comprising:
I. mixing, so as to form a curable composition comprising:
(A) a polysiloxane having the general formula:

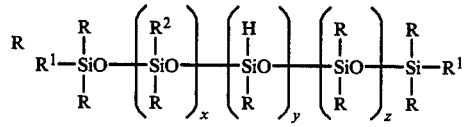

wherein each R is an independently selected substituted or unsubstituted monovalent hydrocarbon radical having from 1 to 20 carbon atoms; $R^1$ is hydrogen, a hydroxyl radical, or a substituted or unsubstituted hydrocarbon or hydrocarbonoxy radical having from 1 to 20 carbon atoms; $R^2$ is a lower alkenyl radical; x is a number such that there is present from about 0.1 to about 20 mole percent vinyl-containing siloxy units; y is a number such that there is present from about 0.5 to about 50 mole percent hydrogen-containing siloxy units; and $x+y+z$ is a number such that the viscosity of said polysiloxane is from about 25 to about 2,500,000 centipoise at 25° C.;

(B) at lease one part by weight per 100 parts by weight of said polydiorganosiloxane of at least one free radical photoinitiator; and (C) a precious metal-containing hydrosilation catalyst;

II. applying a coating of said curable composition to a substrate; and

III. curing said coating to said substrate by exposing the coated substrate to a source of ultraviolet radiation and thereafter thermally curing said coating.

43. The method of claim 42 wherein the substrate is paper.

44. The method of claim 42 wherein the substrate is a circuit board.

45. The method of claim 42 wherein thermal curing is effected at room temperature.

46. The method of claim 42 wherein thermal curing is effected at an elevated temperature.

* * * * *